United States Patent [19]

Quinlan et al.

[11] Patent Number: 4,504,329

[45] Date of Patent: Mar. 12, 1985

[54] PROCESS FOR THE EPITAXIAL DEPOSITION OF III-V COMPOUNDS UTILIZING A BINARY ALLOY AS THE METALLIC SOURCE

[75] Inventors: Kenneth P. Quinlan, Newton; Thomas E. Erstfeld, Bedford, both of Mass.

[73] Assignee: The United States of America as represented by the Secretary of the Air Force, Washington, D.C.

[21] Appl. No.: 539,603

[22] Filed: Oct. 6, 1983

[51] Int. Cl.[3] ............... H01L 21/205; H01L 21/365
[52] U.S. Cl. ........................ 148/175; 29/576 E; 148/174; 156/612; 156/613; 156/614; 156/DIG. 70
[58] Field of Search ............... 148/174, 175; 156/612-614, DIG. 70; 29/576 E

[56] References Cited

U.S. PATENT DOCUMENTS

| | | | |
|---|---|---|---|
| 3,218,205 | 11/1965 | Ruehrwein | 148/175 |
| 3,224,912 | 12/1965 | Ruehrwein | 148/175 |
| 3,441,000 | 4/1969 | Burd et al. | 118/49.1 |
| 3,511,723 | 5/1970 | Burd | 148/175 |
| 3,806,381 | 4/1974 | Asao | 148/175 |
| 3,839,082 | 10/1974 | Kasano et al. | 117/201 |
| 3,888,705 | 6/1975 | Fletcher | 148/175 |
| 4,001,056 | 1/1977 | Groves et al. | 148/175 |
| 4,007,074 | 2/1977 | Ogirima et al. | 148/175 |
| 4,159,919 | 7/1979 | McFee et al. | 148/175 |
| 4,220,488 | 9/1980 | Duchemin et al. | 148/175 |
| 4,253,887 | 3/1981 | Jolly | 148/175 |

OTHER PUBLICATIONS

Kordos et al., Inst. Phys. Conf. Ser. No. 63; Chap 3, Paper presented at Int. Symp. GaAs and Related Compounds, Japan, 1981, p. 131.
Chatterjee et al., J. Crystal Growth, 56, (1982), 591–604.

*Primary Examiner*—William G. Saba
*Attorney, Agent, or Firm*—Donald J. Singer; William J. O'Brien

[57] ABSTRACT

The present invention provides for the deposition of group III-V ternary epitaxial films onto the surfaces of suitable semiconductor substrates. The deposition is accomplished by a vapor phase epitaxy-hydride technique using a group III binary alloy as a group III metal source and phosphine, arsine or stibine as a group V hydride source.

2 Claims, 1 Drawing Figure

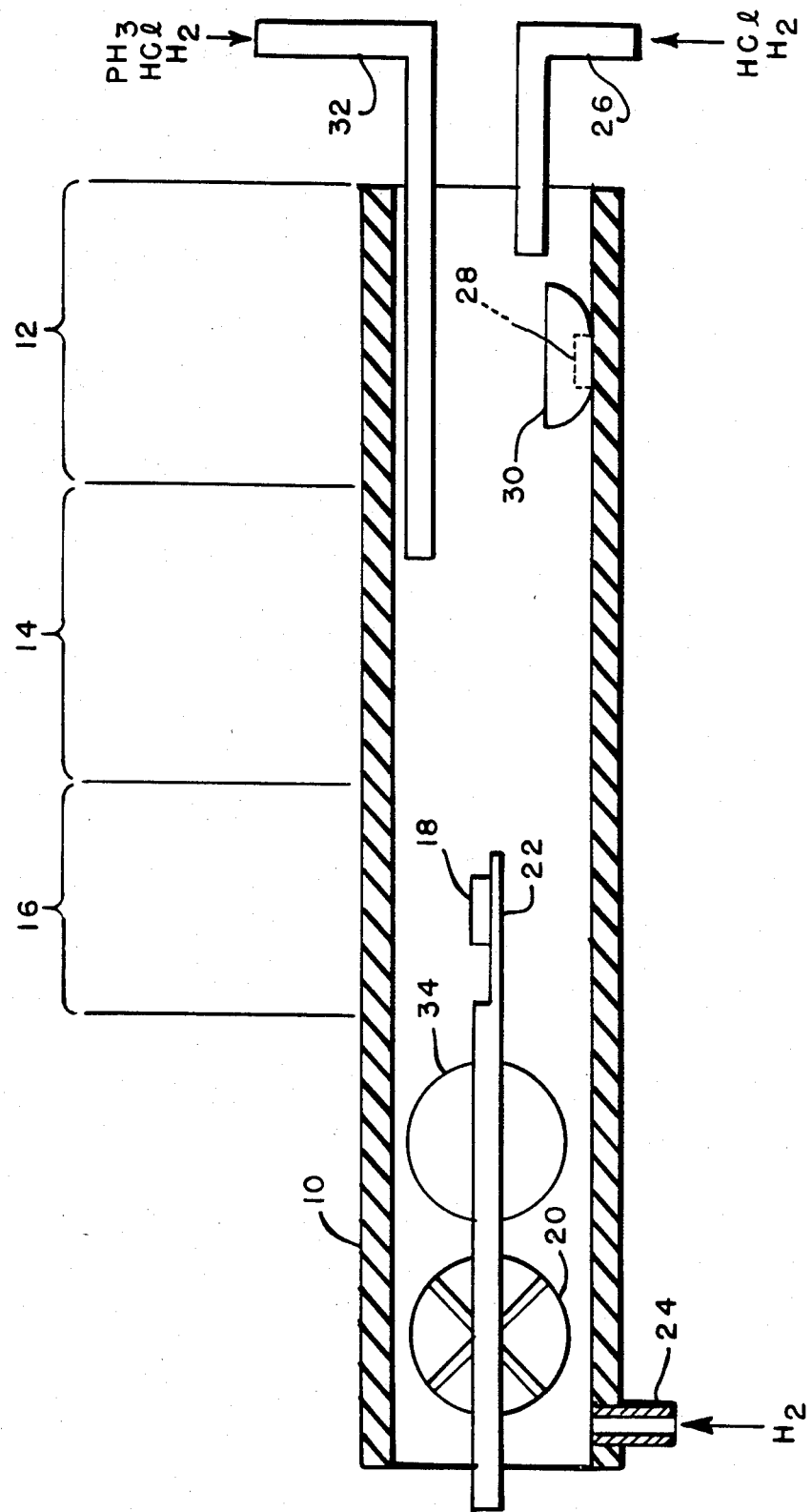

PROCESS FOR THE EPITAXIAL DEPOSITION OF III-V COMPOUNDS UTILIZING A BINARY ALLOY AS THE METALLIC SOURCE

STATEMENT OF GOVERNMENT INTEREST

The invention described herein may be manufactured and used by or for the Government for governmental purposes without the payment of any royalty thereon.

BACKGROUND OF THE INVENTION

The present invention relates in general to a process for depositing epitaxial films of Group III-V semiconductor substrate crystallographically compatible therewith. In a more particular aspect, this invention relates to a process for depositing an epitaxial film of a ternary III-V compound by a vapor phase epitaxy-hydride technique using a binary III-V alloy, as the metallic source. The resulting epitaxial structures find particular utility in the fabrication of light emitting diodes, field effect transistors, and double heterostructure lasers.

Epitaxial films composed of semiconductor compounds containing elements from group III and group V of the Periodic Table of Elements are major components in the fabrication of optoelectronic and microwave devices. These devices provide the foundation for future advances in the area of optical communication and radar technology. Consequently a considerable research effort has evolved in an attempt to provide more useful and efficient III-V compounds of high quality. The need for high quality semiconductor structures is most important in the area of optical communications and radar technology. These devices form an integral part of present day tactical weapons systems. Laser and photodetectors are examples of devices used in optical communication systems, and III-V semiconductor-substrates are the basic structures used in the fabrication of such devices. The use of high quality III-V semiconductors of good morphology with defect-free surfaces contributes significantly to an overall improvement in the efficient operation and extended lifetime of lasers and photodetectors, thus increasing the efficiency and reliability of tactical communication and weapon systems.

The III-V epitaxial structures and semiconductor applications, such as those employed in the fabrication of optical communication and radar systems generally include the arsenides, antimonides, phosphides and nitrides of aluminum, boron, gallium or indium, as well as ternary and quaternary mixtures thereof. These compounds in general, are deposited as crystalline films on semiconductor substrates by either vapor phase or liquid phase epitaxial techniques.

In vapor phase epitaxy, a number of specific processes are known for effecting the deposition of III-V films. These processes usually include the steps of reacting two gaseous mixtures within an enclosed reaction chamber to provide a III-V compound. The two gaseous mixtures generally utilized in vapor phase epitaxy comprise as one of them, a first gaseous mixture formed by contacting a Group III element with hydrogen halide; while the other, or second gaseous mixture, is formed by mixing hydrogen, as a carrier gas, with a Group V element in gaseous form. The III-V compound resulting from the interraction of the two gaseous mixtures is then deposited as an epitaxial film onto a suitable semiconductor substrate. The semiconductor substrate may be similar or different than the material used to form the epitaxial films and generally include III-V compounds, II-VI compounds, as well as silicon and germanium.

One of the better known methods for producing III-V compounds is referred to as the vapor phase epitaxial-hydride technique (VPE-Hydride). The specific details of this technique are set forth in a review paper by G. H. Olsen and T. J. Zamerowski, "Crystal Growth and Properties of Binary, Ternary and Quaternary (In, Ga) (As,P) Alloys grown by the Hydride Vapor Phase Epitaxy Technique", B. R. Pamplin (ed): Progress in Crystal Growth and Characterization, Vol. II, Pergamon Press Ltd., London (1981), pp 309-375.

Unfortunately, the growth of III-V, ternary compounds, especially the preparation of the InGaAs, InGaP and InGaSb ternary alloys is difficult and the resulting crystalline films lack good morphological characteristics and often possess a high number of impurities. The defects produced during the growth of epitaxial films of the above type originate from a number of sources, e.g., dislocation on the substrate, inappropriate epitaxial growth conditions, and the presence of foreign matter or impurities during the growth process. Since these particular compounds are of great importance in the fabrication of double heterostructure lasers, photodetectors, light-emitting diodes and other optical communication devices, a considerable research effort was undertaken in an attempt to provide novel methods for preparing ternary III-V compounds as epitaxial films which possess good morphological characteristics.

SUMMARY OF THE INVENTION

In accordance with this invention, it was found that ternary epitaxial systems can be grown by a vapor-phase epitaxy-hydride technique using a binary alloy such as gallium and indium, as the metallic source for that technique. The utilization of a binary alloy metal source in order to effect the growth of a ternary alloy layer promotes the formation of an epitaxial film with good morphological characteristics and fewer defects than have been achieved heretofore. The group III binary alloy metal source is placed in a quartz container or boat which in turn is placed within a single barrel quartz reactor where it reacts with hydrogen chloride flowing over the alloy to form chloride of the group III element, such as InCl and GaCl.

The group V source, in the form of a gaseous hydride such as arsine ($AsH_3$), phosphine ($PH_3$) or stibine ($SbH_3$), then reacts with the chlorides in the mixing zone of the reactor to form III-V ternary compounds as the epitaxial films on the surfaces of a suitable semiconductor substrate, such as InP in the deposition zone of the reactor.

The invention describes the composition of the alloys and the associated parameters necessary for the formation of III-V ternary epitaxial layers in a single barrel reactor. Prior to this invention, a double barrel quartz reactor tube was necessary to grow the III-V ternary thin films. In those reactors, each barrel contained a boat of the individual group III elements. An additional inlet was necessary for the group V hydride. This invention greatly reduces the cost by substituting an inexpensive reactor for the complex double barrel reactor used heretofore and shortens the time for preparation of the thin layers. The products of this novel technique are high quality III-V epitaxial layers.

Accordingly, the primary object of this invention is to provide a novel technique for preparing group III–V ternary epitaxial films of high quality with relatively few defects and possessing good morphological characteristics.

Another object of this invention is to provide a novel method for depositing III–V ternary compounds as thin epitaxial films on the surface of crystallographically compatible substrates.

Still anothwer object of this invention is to provide a method for forming epitaxial films of III–V ternary semiconductor components by a vapor phase epitaxial technique that utilizes a group III binary alloy as its metallic source.

A further object of this invention is to provide a method which can accomplish the deposition of group III–V ternary epitaxial layer in a simple, single barrel reactor.

The above and still other objects and advantages of the present invention will become more readily apparent upon consideration of the following detailed description thereof when taken in conjunction with the following drawing.

DESCRIPTION OF THE DRAWING

In the drawing:

The FIGURE represents a schematic illustration of a conventional quartz reactor suitable for use in method of this invention.

DESCRIPTION OF THE PREFERRED EMBODIMENT

Pursuant to the above-defined objects, the present invention provides a novel method for depositing Group III–V ternary epitaxial film on the surfaces of suitable semiconductor substrates by the vapor phase epitaxy-hydride technique. It includes the novel concept of using a group III binary alloy as a metallic-source and reactant in forming the III–V epitaxial layers. Hydrogen chloride is introduced into the mixing and deposition zone of a conventional vapor phase reactor by adding it directly to the reactor or, alternatively, by adding it to one of the gaseous reactant mixtures, such as phosphine, which then in turn is introduced into the reactor in accordance with conventional vapor phase epitaxial growth techniques.

In carrying out the method of this invention, the epitaxial layers of the III–V compounds of this invention are grown by vapor phase ternary by interacting two gaseous mixtures within a heated reaction chamber. The first gaseous mixture is formed by passing a mixed stream of a hydrogen carrier gas and hydrogen chloride over the Group III binary alloy, such as InP which is positioned in a crucible located within the first or source zone of a single barrel reactor. The Group III binary alloy metal source is then heated to a temperature sufficient to effect a reaction between it and the hydrogen-hydrogen chloride gaseous mixture. The reaction product is then directed into a second or mixing zone of the reactor. At the same time, a second gaseous mixture, composed of hydrogen chloride, hydrogen carrier gas, and a Group V element hydride such as phosphine, arsine or stibine is introduced into the mixing zone of the reactor and interreacts with the first gaseous mixture at a temperature sufficient to effect the deposition of Group III–V compound, as an epitaxial film, onto the surface of a suitable semiconductor substrate. The substrate is positioned within the third or deposition zone of the reactor.

The epitaxial films formed by the method of this invention are relatively free from defects and possess good morphological characteristics. This provides the films with the properties necessary to insure their utilization in a variety of electronic applications, such as tunnel diodes and light emitting diodes, heterojunction lasers, solar-cells, radiation detectors, photodetectors and filters, as well as other optical communication devices.

The III–V compounds of this invention include the ternary phosphides, antimonides, and arsenides of indium and gallium. Specific example of the ternary epitaxial films of this inventon have the formula $In_{1-x}Ga_xAs$; $In_{1-x}Ga_xP$; and $In_{1-x}Ga_xSb$ wherein x represents an integer having a value of less than one but greater than zero.

Materials useful as substrates for the epitaxial films may include the same or a different compound than those used in preparing the epitaxial film and include III–V compounds, I–VII compounds, II–VI compounds and the elements, silicon and germanium. Also, the materials used to form either the film or the substrate may contain suitable amounts of conventional doping agents which make them especially useful for devices using "surface junctions." The addition of a suitable dopant or impurity permits the creation of n-p or p-n junctions on the surface of a semiconductor of different conductivity. The doping material may be introduced in accordance with any conventional technique, e.g., dispersion within the reactive gaseous mixtures. The invention also contemplates the fabrication of plural epitaxial layers which may be similar or different in composition from preceeding layers.

In order to illustrate how the present invention is carried into effect, reference is made to the drawing which discloses a typical three-zone vapor phase growth apparatus suitable for use with this invention. The apparatus comprises an elongated quartz tube 10 divided into three temperature zones: a source zone 12, a mixing zone 14 and a deposition zone 16. These zones are heated to their desired or predetermined temperature by means of a conventional "clam shell" resistance heater, not shown. A semiconductor substrate 18 of suitable composition, such as an iron doped-indium phosphide wafer cut 2 inches from the (100) plane toward the (111) plane, is placed in a substrate holder 22 and then the substrate and holder are introduced into the forechamber located adjacent gas inlet 24 of the reactor 10. The substrate is then flushed with an inert gas, e.g., hydrogen or nitrogen. The inert gas enters through gas inlet 24 and exits through a port not shown. After flushing, the substrate and holder are further introduced into the reactor 10 through entry port (stopcock) 20 and positioned within the deposition zone 16 maintained at a predetermined temperature of about 700° C.

A first gaseous mixture containing hydrogen chloride and a hydrogen carrier gas is then introduced into the source zone 12 by means of gas inlet 26. The source zone 12 is usually maintained at a temperature of about 800° C. in order to effect a reaction between a reaction between the gaseous mixture and the indium/gallium Group III binary alloy metal source 28. The indium/gallium alloy is prepared by adding the exact amounts of indium and gallium to give the desired composition. Metal source 28 is positioned in a quartz boat or container 30 which, in turn, is located within the source zone 12.

The mixture of hydrogen chloride and hydrogen from inlet 26 passes over the indium/gallium alloy 28 located in crucible 30 where the hydrogen chloride reacts with the indium to form indium chloride (InCl) and the gallium to form gallium chloride (GaCl). The group V hydride, such as $AsH_3$, $PH_3$ or $SbH_3$, is mixed with hydrogen and/or hydrogen chloride gas and enters through inlet 32 and is decomposed by heat to the active species in the mixing zone 14 of the reactor 10. These active species are $As_2$, $As_4$, etc. The active species of the group V hydride react with the chlorides of the group III element at the surface of the substrate 18 in the deposition zone 16 to form epitaxial layers of the group III-V compounds contemplated by this invention.

Gas flow rates for the gaseous reactants are controlled and regulated by Tylan mass flow controllers not shown. The flow rate of the hydrogen chloride in the mixing zone may range from about 0.1 to 1.5 cc/minute. This HCl is the gas introduced through gas inlet 32 in mixture with the Group V element and the hydrogen carrier gas. The flow rate of the Group V hydride gas may vary from 2.3 to 15.9 cc/minute. The carrier hydrogen gas flow rate can vary from 1684 to 2790 cc/minute. The flow rate of the source HCl introduced through inlet 26 is about 1.5 to 6.0 cc/minute. Generally, an epitaxial film of sufficient growth can be prepared in about 45 minutes with the precise time duration for epitaxial growth being determined from the surface area of the substrate, mass the deposit, and density of the resulting group III-V compound film.

A series of InGaAs epitaxial layers were prepared in accordance with this invention using different alloy compositions. The alloy compositions ranged from 3.2 mole% Ga-96.8 mole% In to 15.6 mole% Ga-84.4 mole% In. The temperature of the source, mixing, and deposition zones were 800° C., 850° C., and 700° C., respectively. Various other temperatures may also be used to grow these epitaxial layers.

Excellent quality epitaxial layers of the ternary systems are prepared with this invention. Specific examples of the various parameters used for the growth of an epitaxial layer of InGaAs is shown in table 1.

TABLE 1

| EXPERIMENTAL PARAMETERS FOR THE GROWTH OF $IN_{0.59}Ga_{0.41}As$ ||
| --- | --- |
| ALLOY | INDIUM/GALLIUM |
| Alloy Composition | 11.1 mole % Ga-88.9 mole % In |
| Source Temperature | 800° C. |
| Mixing Temperature | 850° C. |
| Deposition Temperature | 725° C. |
| $AsH_3$(10% in $H_2$) Flow Rate | 10 cc/min (pure $AsH_3$) |
| $H_2$ Flow Rate (inlet 4) | 445 cc/min |
| HCl Flow Rate | 2.3 cc/min |
| $H_2$ Flow Rate (inlet 3) | 445 cc/min |
| Time of Growth | 225 min |

The characteristics of the grown epitaxial layer of the InGaAs are shown in table 2.

TABLE 2

| CHARACTERISTICS OF EPITAXIAL LAYER OF InGaAs ||
| --- | --- |
| Composition | $In_{0.59}Ga_{0.41}As$ |
| Growth Rate | 0.208 μm/min |
| Layer Thickness | 47 μm |
| Carrier Concentration (n) at room temperature (RT) | $1.5 \times 10^{15}$ cm$^{-3}$ |
| Mobility (μ) at RT | 8400 cm$^2$/v-sec |

Various components of the ternary can be obtained by varying the alloy composition. An alloy composition of 12 mole% Ga-88 mole% In will give $In_{0.53}Ga_{0.47}As$. This composition is lattice-matched to Indium Phosphide and can be used in many optoelectronic and microwave devices. These devices are used in optical communications and radar systems respectively.

In general, suitable semiconductor substrates can be obtained from Liquid Encapsulated Czochralski (LEC) grown crystalline boules. Slices of th boule are cut off to expose the crystallographic plane of the sliced boule for deposition of the III-V compound over the surface of the slice. The crystallographic plane may have any of the crystallographic faces exposed e.g. (100), (110), (111), etc. The slices are then polished, degreased and etched in accordance with conventional technique and then blow-dried with helium.

The epitaxial layers of the III-V compounds are the basic structures for the fabrication of many new and useful electronic devices. Among these devices that utilize epitaxial layered structures are lasers, light-emitting diodes, photodetectors, solar cells, optoelectronic switches, field-effect transistors, gunn-effect diodes, varactors, and IMPATTS. The lasers and photodetectors are suitable for use in applications such as audio disk playbacks and laser printers.

While the principles of this invention have been described with particularity, it should be understood by those skilled in the art that various alterations and modifications can be made without departing from the spirit of the invention, and that all such modifications as are included within the scope of the appended claims are intended to be included herein.

We claim:

1. A method for preparing and depositing an epitaxial crystalline film comprised of a III-V compound onto the surface of a suitable substrate crystallographically compatable with said film, said method comprising the steps of:

(A) positioning a substrate suitable for epitaxial growth of III-V compounds on the surface thereof in a first zone located at one end of a reaction chamber while maintaining said first zone at a predetermined temperature of about 700° C.;

(B) positioning a binary metal alloy source material composed of about 12.2 mole percent gallium and about 87.8 mole percent indium in a second zone located at the other end of said chamber while maintaining said second zone at a predetermined temperature of about 800° C.;

(C) introducing a gaseous mixture composed of (a) a hydrogen chloride gas and (b) an inert carrier gas into said heated second zone and passing said hydrogen chloride gas mixture over said binary metal alloy to produce a first gaseous reactant mixture formed by the reaction between said hydrogen chloride and said binary metal alloy source material;

(D) introducing said first gaseous reactant mixture into a third zone of said chamber, said third zone being maintained at a predetermined temperature of about 850° C. and positioned intermediate said first and second zones;

(E) introducing a second gaseous reactant into said third zone simultaneously with the entry of said first gaseous reactant mixture into said third zone, said second gaseous reactant comprising a mixture of (a) a hydride selected from the group consisting of phosphine, arsine, and stibine and (b) an inert carrier gas to form an admixture between said first gaseous reactant mixture and said second gaseous reactant;

(F) introducing said admixture into said heated first zone and contacting said substrate to affect the deposition of a $Ga_{0.47}In_{0.53}As$ ternary epitaxial crystalline film thereon.

2. A method in accordance with claim 1 wherein said inert gas comprises hydrogen.

* * * * *